US008161633B2

(12) United States Patent
Shacklette et al.

(10) Patent No.: US 8,161,633 B2
(45) Date of Patent: Apr. 24, 2012

(54) METHOD OF FABRICATING NON-PLANAR CIRCUIT BOARD

(75) Inventors: Lawrence W. Shacklette, Melbourne, FL (US); Louis J. Rendek, West Melbourne, FL (US); Paul B. Jaynes, Indialantic, FL (US); Philip A. Marvin, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 769 days.

(21) Appl. No.: 11/695,685

(22) Filed: Apr. 3, 2007

(65) Prior Publication Data
US 2008/0244898 A1 Oct. 9, 2008

(51) Int. Cl.
*H05K 3/00* (2006.01)
(52) U.S. Cl. ........... 29/846; 174/250; 264/553; 264/554
(58) Field of Classification Search ............. 29/846, 29/848; 174/250, 254; 264/553, 554
See application file for complete search history.

(56) References Cited

U.S. PATENT DOCUMENTS

| 4,247,755 | A | | 1/1981 | Smith, Jr. et al. |
| 5,264,061 | A | | 11/1993 | Juskey et al. |
| 5,535,141 | A | | 7/1996 | Lussi |
| 5,903,432 | A | * | 5/1999 | McMahon .................. 361/690 |
| 6,032,357 | A | * | 3/2000 | Wojewnik .................... 29/846 |
| 6,268,026 | B1 | | 7/2001 | Jester et al. |
| 6,334,922 | B1 | | 1/2002 | Tanaka et al. |
| 6,521,830 | B1 | * | 2/2003 | Platz ............................. 174/50 |
| 6,666,990 | B2 | | 12/2003 | Shepherd et al. |
| 6,987,307 | B2 | | 1/2006 | White et al. |
| 7,105,106 | B2 | | 9/2006 | Samuels et al. |
| 7,260,890 | B2 | | 8/2007 | White et al. |
| 2003/0036790 | A1 | | 2/2003 | Corbett et al. |
| 2003/0121767 | A1 | | 7/2003 | Caldwell |
| 2006/0104037 | A1 | | 5/2006 | Smith et al. |

FOREIGN PATENT DOCUMENTS

| DE | 10 2005 017002 | | 10/2006 |
| WO | WO 8705557 A1 | * | 9/1987 |
| WO | WO-2004103038 A1 | | 11/2004 |

OTHER PUBLICATIONS

Gore Speedboard C Prepreg [online]. GORE Creative Technologies [retrieved Oct. 11, 2007] Retrieved from GORE Creative Technologies website using Internet <URL: http://www.gore.com/en_xx/products/electronic/dielectric/gore_speedboard_c_prepreg.html>.

(Continued)

*Primary Examiner* — Livius R Cazan
(74) *Attorney, Agent, or Firm* — Fox Rothschild, LLP; Robert J. Sacco

(57) ABSTRACT

A method for forming a circuit board is provided. The method includes forming a circuit board substrate (112) from a circuit board material. The method also includes positioning the circuit board substrate on a rigid structure (114) having a three dimensional contoured surface (300). The method further includes applying heat and applying pressure to the circuit board substrate to at least partially conform the circuit board substrate to the three dimensional contoured surface. If the circuit board substrate (112) is a clad circuit board substrate, then a circuit pattern is formed on the circuit board substrate prior to the steps of applying heat and applying pressure. However, if the circuit board substrate (112) is an unclad circuit board substrate, then a circuit pattern is disposed on the circuit board substrate after the steps of applying heat and applying pressure.

21 Claims, 12 Drawing Sheets

OTHER PUBLICATIONS

BT Resin Glass Fabrics Copper Glad Laminates. Product Description [online]. Mitsubishi International Corporation [retrieved Nov. 9, 2007]. Retrieved from the Internet: <URL : www.micchem.com/products/BtResin.htm>.

Hunziker, Dr. Werner, "Chip Assembly on MID (Molded Interconnect Device", found on the Internet at <<http://www.harting.com/en/en/en/techinfo/tecnews/data/artikel/01419/index.en.html>>; printed on Dec. 5, 2007.

Office Action mailed Jun. 8, 2011, in Canadian Application No. 2,682,600, in the name of Harris Corporation.

* cited by examiner

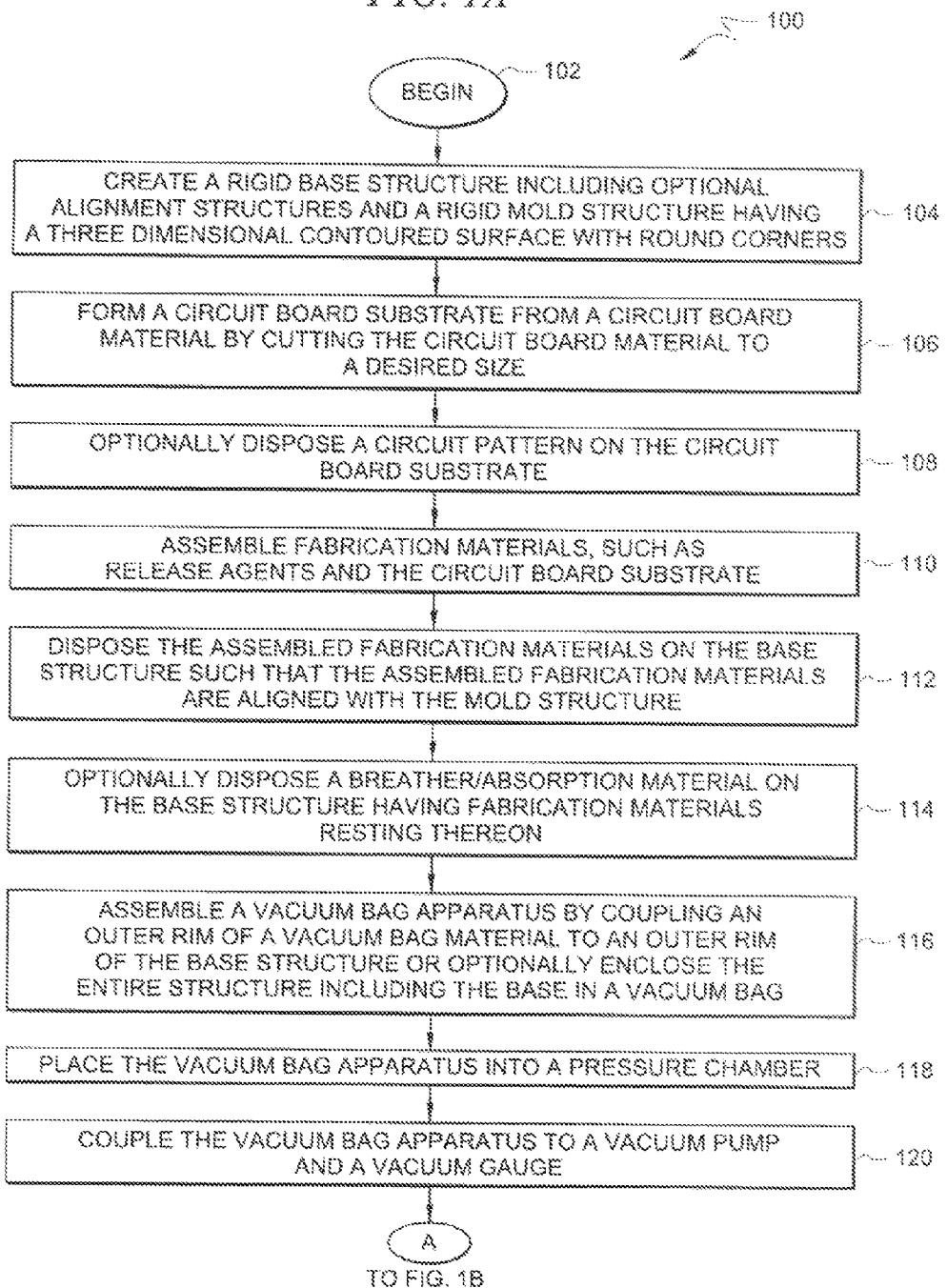

METHOD OF FABRICATING NON-PLANAR CIRCUIT BOARD

BACKGROUND OF THE INVENTION

1. Statement of the Technical Field

The inventive arrangements relate to methods, systems, and apparatus for fabricating a non-planar circuit board. More particularly, the present invention relates to a method for fabricating a non-planar circuit board comprised of a liquid crystal polymer circuit board material or other thermoplastic polymer material.

2. Description of the Related Art

Within the government communication market, there is an increasing push to further miniaturize systems with the use of chip-scale packages, flip-chip bonding, and other advances over traditional packaging techniques. Beyond simple miniaturization, there is also the desire to integrate circuitry with structure and cosmetic packaging to achieve the ability to incorporate electrical functions within articles having very different form factors from those that traditionally have been used. This goal serves to combine interest in achieving both miniaturization and full integration.

There is also a need for a versatile board substrate technology that provides a reduced dielectric constant over that of conventional board materials, and thereby provides means for improving the density of high radio frequency (RF) circuits. Additionally, for airborne and space applications, there is a need for a light board material that can also play a role in providing mechanical structure.

Liquid crystal polymer (LCP) materials are relatively light, ultra-thin materials that can permanently mold to any shape. LCP materials also have relatively low moisture and oxygen permeability characteristics as compared to conventional circuit board materials. As such, LCP materials are suitable for making thin, multi-layer circuit boards as well as highly detailed, high performance planar circuit boards. LCP materials are also suitable for making three-dimensional (3D) micro-electro-mechanical circuits, LCP materials are further suitable for making circuit boards intended for extreme temperature applications and/or intense radiation applications.

SUMMARY OF THE INVENTION

The invention concerns a method for forming a circuit board. The method includes forming a circuit board substrate from a circuit board material. The method also includes positioning the circuit board substrate on a rigid structure having a three dimensional contoured surface. The method further includes applying heat and applying pressure to the circuit board substrate to at least partially conform the circuit board substrate to the three dimensional contoured surface.

According to an aspect of the invention, the method includes disposing a circuit pattern on the circuit board substrate prior to the steps of applying heat and applying pressure to the circuit board substrate. Alternatively, the method includes disposing a circuit pattern on the circuit board substrate after the steps of applying heat and applying pressure to the circuit board substrate.

According to another aspect of the invention, the method includes selecting the circuit board substrate to have a planar configuration. The method also includes selecting the circuit board material to be a thermoplastic polymer material, such as a liquid crystal polymer material. The thermoplastic polymer material includes a single sheet of circuit board material or two or more layers of circuit hoard material.

According to another aspect of the invention, the method includes removing the circuit board substrate from the three dimensional contoured surface after applying heat and applying pressure to the circuit board substrate. In this regard, it should be appreciated that a release agent may be optionally disposed between the circuit board substrate and the three dimensional contoured surface prior to positioning the circuit board substrate on a rigid structure. The release agent is selected from the group consisting of a film, a liner, a lubricant, and a wax.

According to another embodiment of the invention, the method includes permanently adhering the circuit board substrate to the three dimensional contoured surface in the steps of applying heat and applying pressure to the circuit board substrate. In this regard, if should be appreciated that an adhesive agent can be disposed between the circuit board substrate and the three dimensional contoured surface prior to positioning the circuit board substrate on a rigid structure. Alternatively, at least one of the circuit board material and a material forming the three dimensional contoured surface is selected to produce an adhesive bond between the circuit hoard material and the three dimensional contoured surface in the steps of applying heat and applying pressure to the circuit board substrate.

The method includes positioning the circuit board substrate and the rigid structure in an interior volume at least partially defined by a vacuum bag. The method also includes creating a pressure differential comprising a reduced pressure within the interior volume relative to an environment external to the interior volume. This pressure differential can be created by evacuating at least a portion of a gas contained in the interior volume. This pressure differential can also be created or enhanced by positioning the circuit board substrate and the rigid structure in a pressure chamber, and increasing a pressure in the pressure chamber. The method further includes increasing the pressure differential after applying heat to the circuit board substrate. According to another aspect of the invention, the step of applying heat to the circuit board substrate further includes equilibrating the circuit board substrate at a temperature prior to increasing the pressure. The temperature is selected to be less than a temperature of a melting point of the circuit board material.

According to yet another aspect of the invention, the method includes selecting the rigid structure to include a tool and a part releasably disposed on the tool. The method also includes permanently bonding the part to the circuit board substrate. The method further includes removing from the tool the circuit board substrate with the part permanently bonded thereto after applying heat and applying pressure to the circuit board substrate.

BRIEF DESCRIPTION OF THE DRAWINGS

Embodiments will be described with reference to the following drawing figures, in which like numerals represent like items throughout the figures, and in which:

FIG. 1A-1C are collectively a flow diagram of a method for fabricating a circuit board that is useful for understanding the invention.

DETAILED DESCRIPTION OF THE PREFERRED EMBODIMENTS

An embodiment of the present invention will now be described with respect to FIG. 1 through FIG. 17. Some embodiments of the present invention provide methods, systems, and apparatus relating to the fabrication of a non-planar circuit board. Such methods, systems, and apparatus also relate to the fabrication of a non-planar circuit pattern disposed on a circuit board substrate. The present invention further relates to methods, systems, and apparatus relating to the fabrication of a multi-layer, non-planar circuit board having defect-free interconnects.

Referring now to FIG. 1A, there is provided a flow diagram of a method 100 for fabricating a circuit board that is useful for understanding the invention. As shown in FIG. 1, the method 100 begins with step 102 and continues with step 104. In step 104, a rigid base structure is created. The rigid base structure is formed of a rigid material suitable to withstand relatively high temperature and pressures. Such rigid materials include, but are not limited to, copper, aluminum, and steel. The rigid base structure can also be formed of a non-stick material, such as Teflon® available from E. I. Du Pont De Nemours and Company, of Wilmington, Del. A perspective view of a rigid base structure 200 is provided in FIG. 2.

Figure 1B:
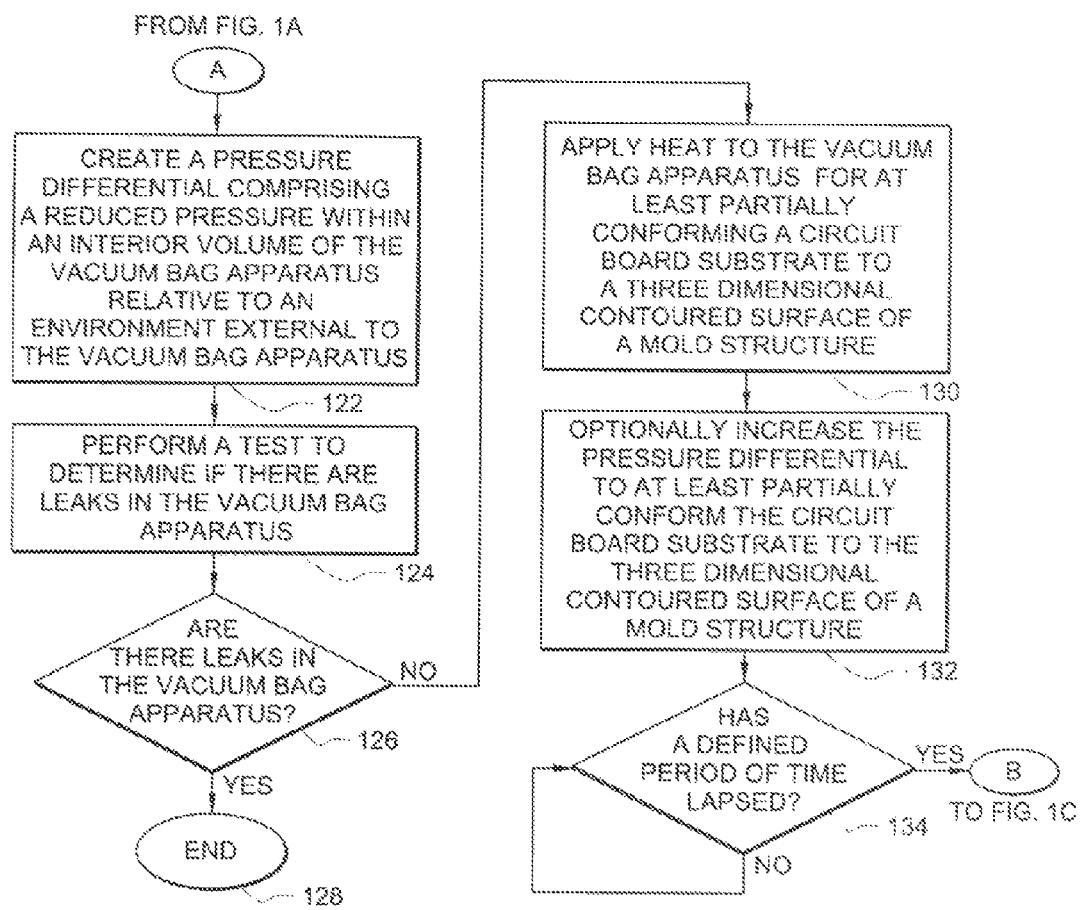
Figure 1C:
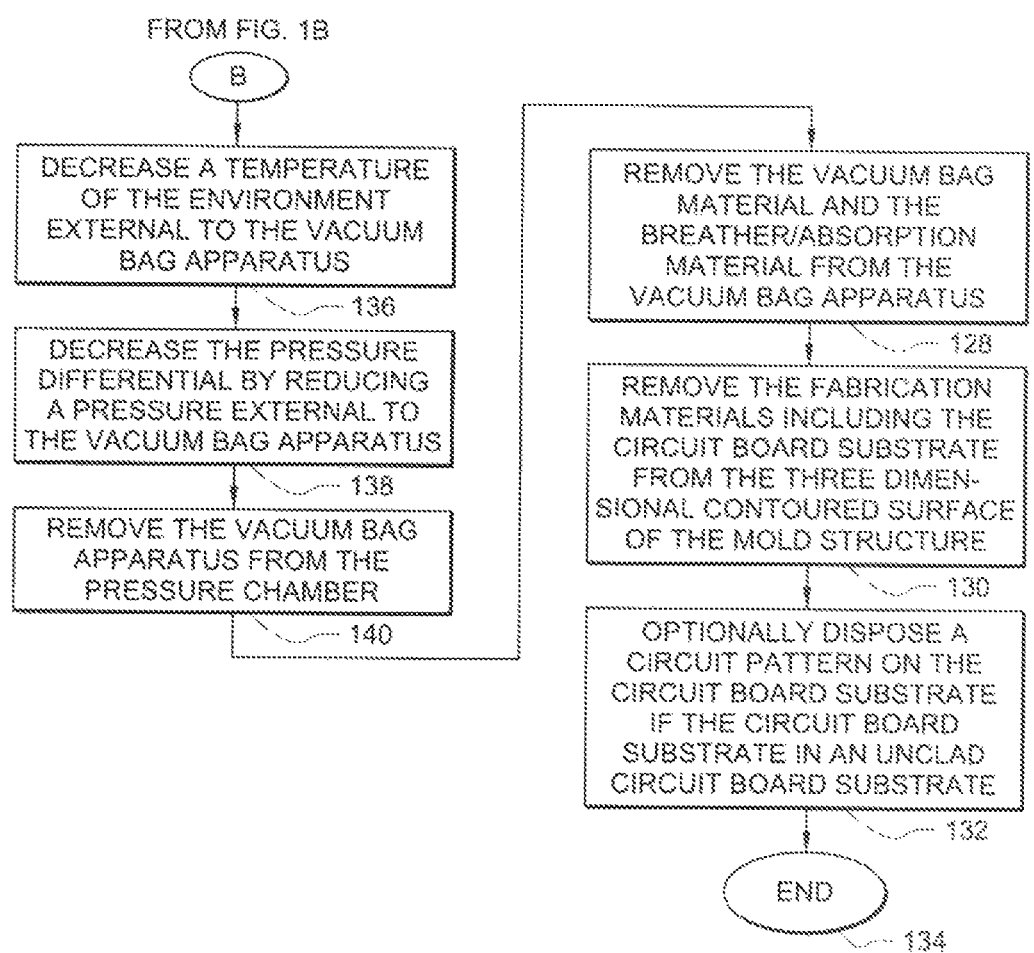
Figure 2:
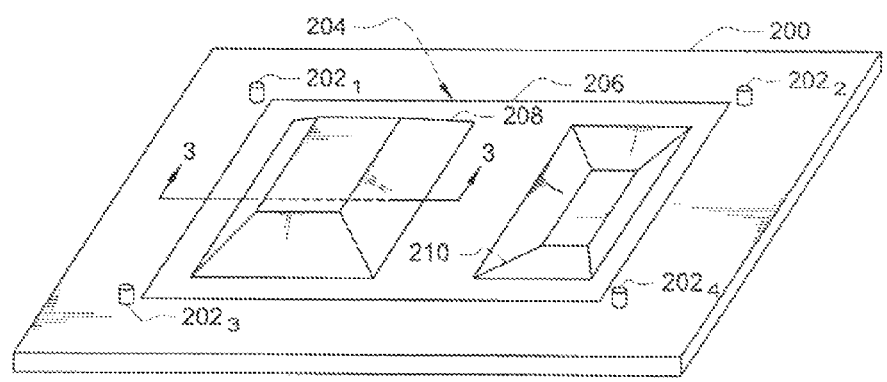
FIG. 2 is a perspective view of a rigid base structure that is useful for understanding the present invention.

As shown in FIG. 2, the rigid base structure 200 can be comprised of alignment structures $202_1$-$202_4$. The alignment structures $202_1$-$202_4$ can advantageously be provided when a registration is required between fabrication materials and a rigid mold structure 204. The rigid mold structure 204 may be optionally fixed to the rigid base structure 200 or engaged by two or more of the alignment structures $202_1$-$202_4$. The rigid mold structure 204 has a three dimensional (3D) contoured surface 206 to which fabrication materials conform when heat and pressure are applied thereto. The 3D contoured surface 206 can include a projecting relief 208 and/or a hollow relief 210.

Figure 3:
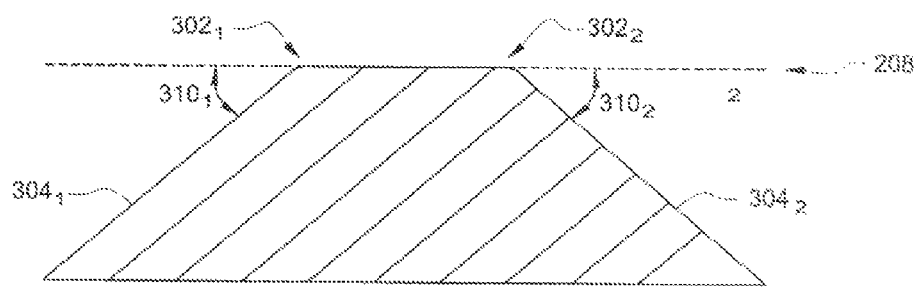
FIG. 3 is a cross-sectional view of a projecting relief taken along line 3-3 of FIG. 2.

A cross sectional view of the projecting relief 208 is provided in FIG. 3. As shown in FIG. 3, the projecting relief 208 is advantageously designed to include corners $302_1$, $302_2$ and walls $304_1$, $304_2$. The corners $302_1$, $302_2$ have a radius selected in accordance with a particular rigid mold structure 304 application. For example, the corners $302_1$, $302_2$ have a radius suitable for offsetting severe elongation of a circuit pattern at the corners $302_1$, $302_2$ when heat and pressure are applied to a circuit board substrate. As will be appreciated by a person skilled in the art, severe elongation of a cladding material disposed on a circuit board substrate can cause an undesirable circuit pattern failure (i.e., damage and cracking of a cladding material). As such, each corner $302_1$, $302_2$ preferably has at least one (1) millimeter (mm) to three (3) millimeter (mm) radius for preventing damage to a circuit pattern when heat and pressure are applied thereto. Still, the invention is not limited in this regard.

As shown in FIG. 3, the walls $304_1$, $304_2$ are non-vertical walls designed for providing a uniform elongation of a circuit pattern along the walls $304_1$, $304_2$ when heat and pressure are applied to a circuit board substrate. In this regard, it should be appreciated that the projecting relief 208 is designed with wall angles $310_1$, $310_2$ substantially less than ninety degrees (90°). Still, the invention is not limited in this regard.

As will be understood by a person skilled in the art, the wall angles $310_1$, $310_2$ can be defined by a mathematical Equation (1), under the assumption that the elongation of the substrate and cladding occurs predominantly along the length of the walls $304_1$, $304_2$.

$$\Theta_{max} = \cos^{-1}(100\%/(EL+100\%)) \qquad (1)$$

where $\Theta_{max}$ is the maximum angle value for the wall angles $310_1$, $310_2$. EL is the elongation to break limit in percent for a cladding material disposed on a circuit board substrate (described below in relation to FIG. 3).

For example, elongation to break limits (ELs) for a copper cladding material are listed in Table 1.

TABLE 1

| ELECTRODEPOSITED (ED) COPPER | | | ROLLED COPPER | | |
|---|---|---|---|---|---|
| WEIGHT (ounce) | THICKNESS (micrometers) | ELONGATION LIMIT (percent) | WEIGHT (ounce) | THICKNESS (micrometers) | ELONGATION LIMIT (percent) |
| 0.5 oz | 17.0 um | 20.0% | 0.5 oz | 17.0 um | 8.0% |
| 1.0 oz | 34.0 um | 28.0% | 1.0 oz | 34.0 um | 13.0% |
| 2.0 oz | 68.0 um | 42.0% | 2.0 oz | 68.0 um | 27.0% |

By substituting the above listed EL values into Equation (1), the maximum angle values $\Theta_{max}$ for the wall angles $310_1$, $310_2$ of a projecting relief 208 to be used in fabricating a non-planar circuit board with the above listed copper cladding materials can be calculated. These calculated maximum angle values $\Theta_{max}$ are listed in Table 2. It should be understood that it is preferred to restrain the wall angle by design to an angle much less than the limit value, $\Theta_{max}$, so that the elongation is preferably held to less than one half (½) the elongation to break limit and more preferably to less than one fourth (¼) the elongation to break limit as determined by the mathematical Equation (1).

TABLE 2

| COPPER WEIGHT (ounce) | EL OF ED COPPER (percent) | $\Theta_{max}$ FOR ED COPPER (degrees) | EL OF ROLLED COPPER (percent) | $\Theta_{max}$ FOR ROLLED COPPER (degrees) |
| --- | --- | --- | --- | --- |
| 0.5 oz | 20.0% | 33.6° | 8.0% | 22.2° |
| 1.0 oz | 28.0% | 38.6° | 13.0% | 27.8° |
| 2.0 oz | 42.0% | 45.2° | 27.0% | 38.1° |

Referring again to FIG. 1A, the method 100 continues with step 106 where a circuit board substrate is formed from a circuit board material. This step can involve cutting a circuit board material to a desired shape and size. This step can also involve forming alignment apertures in the circuit board material. A perspective view of a circuit board substrate 400 is provided in FIG. 4.

Figure 4:
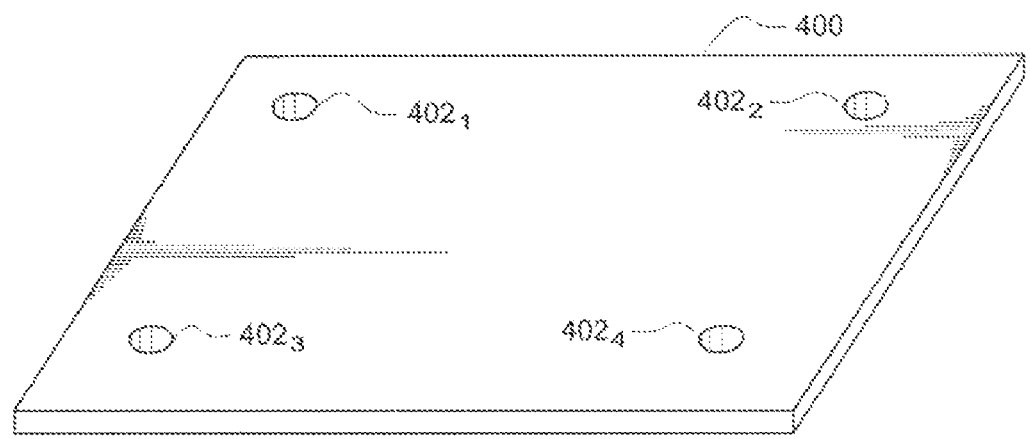
FIG. 4 is a perspective view of a circuit board substrate that is useful for understanding the present invention.

As shown in FIG. 4, the circuit board substrate 400 is comprised of optional alignment apertures $402_1$-$402_4$. The alignment apertures $402_1$-$402_4$ are formed in the circuit board substrate using any means known in the art, such as a drilling means or a hole punching means. The alignment apertures $402_1$-$402_4$ are sized and shaped for receiving the optional alignment structures $202_1$-$202_4$ described above in relation to FIG. 2.

According to an aspect of the invention, the circuit board substrate 400 is comprised of a liquid crystal polymer (LCP) or other thermoplastic polymer circuit board material. For example, the circuit board material can be an R/flex® 3000 circuit board material available from Rogers Corporation, of Rogers, Conn. According to another aspect of the invention, the circuit board substrate 400 is comprised of a single layer clad circuit board material, a single layer unclad circuit board material, a multi-layer (or laminate) clad circuit board material or a multi-layer (or laminate) unclad circuit board material. Still, the invention is not limited in this regard.

Referring again to FIG. 1A, the method 100 continues with step 110 where a circuit pattern is optionally disposed on the circuit hoard substrate 400 using any technique known in the art. Such techniques include, but are not limited to, etching techniques, inkjet printing technique, and silk screening techniques. After step 110, step 112 is performed where fabrication materials are assembled. A side view of assembled fabrication materials 502 is provided in FIG. 5.

Figure 5:
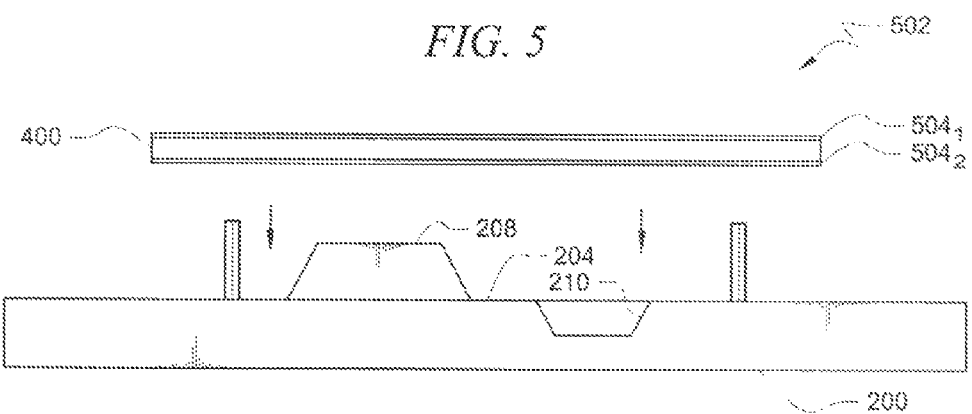
FIG. 5 is a schematic illustration of fabrication materials being disposed on the rigid base structure of FIG. 2 that is useful for understanding the present invention.
Figure 6:
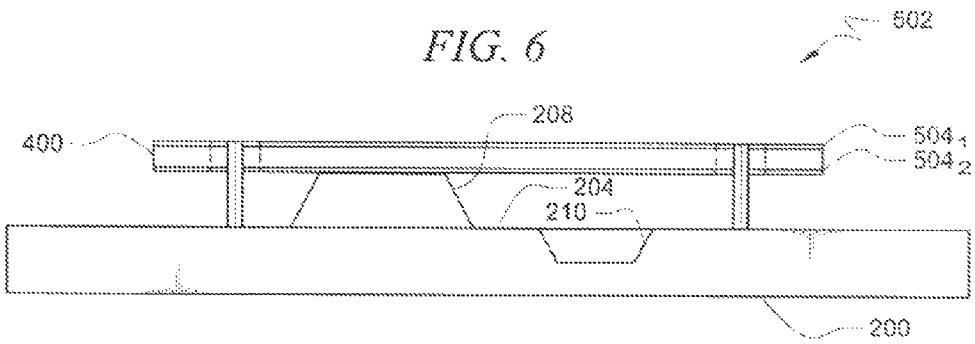
FIG. 6 is a side view of fabrication materials disposed on the rigid base structure shown in FIG. 2 that is useful for understanding the present invention.
Figure 7:
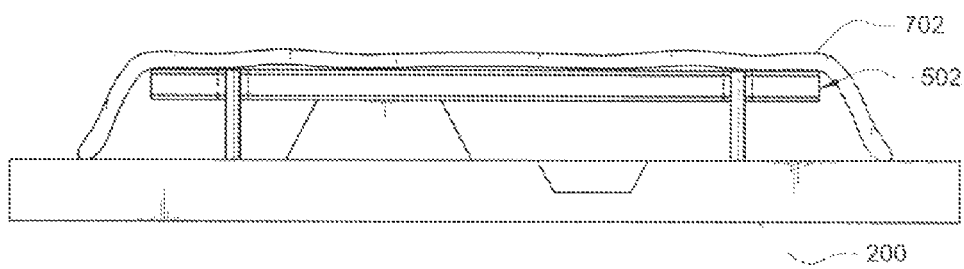
FIG. 7 is a side view of a breather/absorption material disposed on the base structure having fabrication materials disposed thereon that is useful for understanding the present invention.

As shown in FIG. 5, the fabrication materials include the circuit board substrate 400 and/or one or more release agents $504_1$, $504_4$. The release agent $504_2$ is advantageously provided to prevent adhesion of the circuit board substrate 400 to the base structure 200 when heat and pressure are applied thereto. Similarly, the release agent $504_1$ is provided to prevent adhesion of a breather/absorption material (described below in relation to FIG. 7) to the fabrication materials 502 when heat and pressure are applied thereto. The release agents $504_1$, $504_2$ include, but are not limited to, films, wax sheets and release liners. For example, the release agent may consist of a Teflon® liner. Alternatively, a low surface energy release film may be applied to the circuit board substrate 400 or a surface of the mold structure 204.

Referring again to FIG. 1A, the method continues with step 112, in step 112, the assembled fabrication materials 502 are disposed on the base structure 200 such that the fabrication materials 502 are aligned with the mold structure 204. A schematic illustration of assembled fabrication materials 502 being disposed on the rigid base structure 200 is provided in FIG. 5. A schematic illustration of the assembled fabrication materials 502 disposed on the rigid base structure 200 is provided in FIG. 6.

After step 112, step 114 is performed where a breather/absorption material is optionally disposed on the rigid base structure 200 having the fabrication materials 502 resting thereon. A side view of a breather/absorption material 702 disposed on the fabrication materials 502 and the base structure 200 is provided in FIG. 7. As will be appreciated by a person skilled in the art, the breather/absorption material 702 is provided for ensuring uniform vacuum pressure across the fabrication materials 502 when heat and pressure are applied thereto. The breather/absorption material 702 is also provided for absorbing excess resin from a multi-layer (or laminate) circuit board substrate 400. Breather/absorption materials are well known to persons skilled in the art. Thus, the breather/absorption material 702 will not be described in detail herein. However, it should be appreciated that any breather/absorption material known in the art can be used without limitation.

Figure 8:
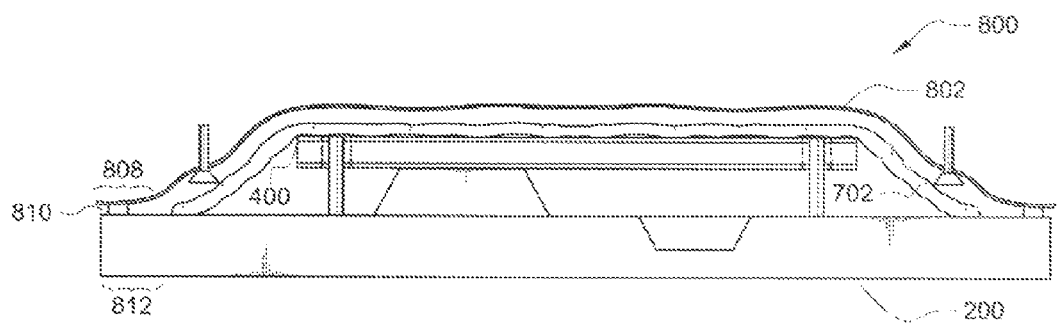
FIG. 8 is a side view of an assembled vacuum bag material apparatus that is useful for understanding the invention.
Figure 9:
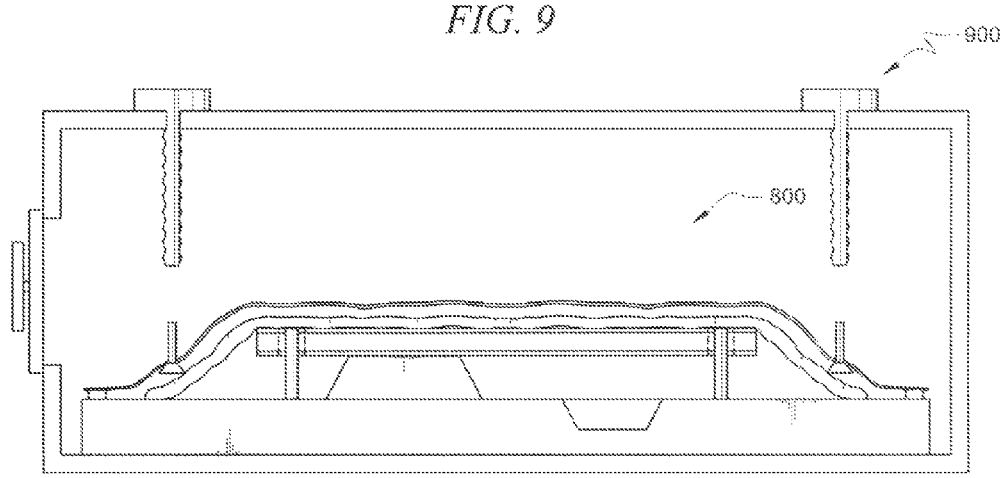
FIG. 9 is a side view of the vacuum bag apparatus disposed in a pressure chamber that is useful for understanding the invention.

As shown in FIG. 1A, the method 100 continues with step 116. In step 116, a vacuum bag apparatus is assembled. A side view of an assembled vacuum bag apparatus 800 is provided in FIG. 8. As shown in FIG. 8, the vacuum bag apparatus 800 is comprised of a vacuum bag material 802 disposed on the breather/absorption material 702. The vacuum bag material 802 is a flexible dimensionally stable film, such as Kapton® available from E. I. Du Pont De Nemours and Company, of Wilmington, Del. The vacuum bag material 802 forms a seal with the base structure 200. For example, an outer rim 808 of the vacuum bag material 802 is coupled to an outer rim 812 of the base structure 200 with a sealant means 810. The sealant means includes, but is not limited to, a mechanical connector means, sealant tape, epoxy, adhesive, and/or glue.

Referring again to FIG. 1A, the method 100 continues with a step 118. In step 118, the vacuum bag apparatus 800 is placed in a pressure chamber. A schematic illustration of the vacuum bag apparatus 800 disposed in a pressure chamber 900 is provided in FIG. 9. In this regard, it should be appreciated that the pressure chamber 900 is a container in which heat and pressure are applied to materials disposed therein.

According to an embodiment of the invention, the pressure chamber 900 is an autoclave. The autoclave can be selected as an autoclave in which temperature and pressure sequences can be software defined and pre-programmed into a memory of the autoclave. For example, the autoclave is an Econoclave® available from ASC Process Systems, of Sylmar, Calif. Still, the invention is not limited in this regard.

Referring again to FIG. 1A, the method 100 continues with step 120 where the vacuum bag apparatus 800 is coupled to a vacuum pump and a vacuum gauge. As will be understood by a person skilled in the art, a leak free connection between the vacuum bag apparatus 800 and each of the listed devices is necessary for forming a non-planar circuit board substrate by applying a defined amount of pressure thereto. A schematic illustration of the vacuum bag apparatus 800 coupled to a vacuum pump 1002 and a vacuum gauge 1004 is provided in FIG. 10.

Figure 10:
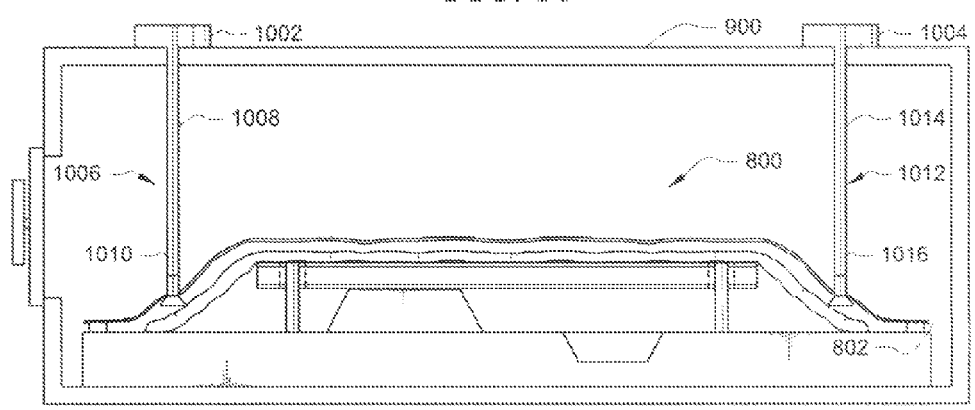
FIG. 10 is a side view of the vacuum bag apparatus coupled to a vacuum pump and a vacuum gauge that is useful for understanding the invention.

As shown in FIG. 10, a coupling means 1008 is provided for coupling the vacuum bag material 802 to a vacuum pump 1002. As will be understood by a person skilled in the art, the vacuum pump 1002 is provided for selectively reducing a pressure in an inferior volume of the vacuum bag material 802 by evacuating at least a portion of a gas contained therein. The coupling means 1006 is comprised of a tubular conduit 1008 and a connector means 1010. The tubular conduit 1008 is selected in accordance with a particular vacuum bag apparatus 800 application. For example, the tubular conduit 1008 is selected as a flexible tube-like structure formed of a material suitable to withstand high temperatures and pressures. The connector means 1010 is configured to maintain a leak-free seal between the vacuum bag material 802 and the tubular conduit 1008 at high temperatures and pressures. For example, the connector means 1010 is comprised of a top bolt, a seal ring, and a threaded valve base having a vacuum feed through aperture. Still, the invention is not limited in this regard.

A coupling means 1012 is also provided for coupling the vacuum bag material 802 to a vacuum gauge 1004. As will be understood by a person skilled in the art, a vacuum gauge is provided for tracking pressures inside the vacuum bag apparatus 800. The coupling means 1012 is comprised of a tubular conduit 1014 and a connector means 1016. The tubular conduit 1014 is selected in accordance with a particular vacuum bag apparatus 800 application. For example, the tubular conduit 1014 is selected as a flexible tube-like structure formed of a material suitable to withstand high temperatures and pressures. The connector means 1018 is configured to maintain a leak free seal between the tubular conduit 1014 and the vacuum bag material 802 at the high temperatures and pressures. For example, the connector means 1016 is comprised of a fop bolt, a seal ring, and a threaded valve base having a vacuum feed through aperture. Still, the invention is not limited in this regard.

Referring again to FIG. 1B, the method 100 continues with step 122 of FIG. 1B. In step 122, a pressure differential is created by reducing pressure within the vacuum bag apparatus 800 relative to an environment external to the vacuum bag apparatus 800. This step can involve evacuating at least a portion of a gas contained in the interior volume of the vacuum bag apparatus 800. According to an embodiment of the invention, a gas contained in the interior volume of the vacuum bag apparatus 800 is evacuated to a vacuum gauge 106 pressure of less than negative seven hundred forty millimeters of mercury (−740 mm Hg). Still, the invention is not limited in this regard.

Figure 11:
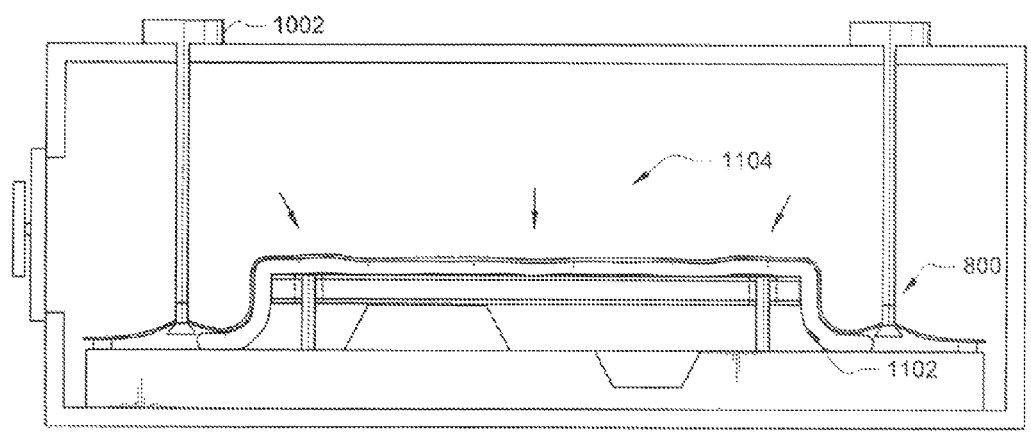
FIG. 11 is a side view of an at least partially evacuated vacuum bag apparatus that is useful for understanding the invention.
Figure 12:
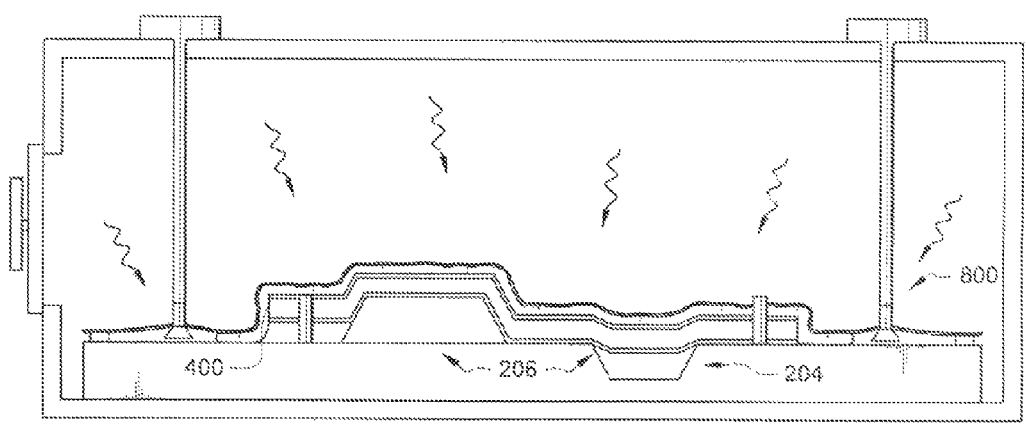
FIG. 12 is a side view of at least partially evacuated vacuum bag apparatus having an increased temperature applied thereto that is useful for understanding the invention.

A schematic illustration of an at least partially evacuated vacuum bag apparatus 800 is provided in FIG. 11. As shown in FIG. 11, at least a portion of a gas contained in the inferior volume 1102 of the vacuum bag apparatus 800 has been evacuated through use of the vacuum pump 1002. As such, a pressure within the interior volume 1102 is reduced. In effect, a pressure differential is created between a pressure in the interior volume 1102 and a pressure in an environment external 1104 to the vacuum bag apparatus 800.

Referring again to FIG. 1B, the method 100 continues with step 124. In step 124, a test is optionally performed to determine whether there are leaks in the vacuum bag apparatus 800. Such tests are well known to persons skilled in the art. Thus, the test to determine whether there are leaks in the vacuum bag apparatus 800 will not be described in great detail herein. However, it should be appreciated that any test known in the art that is suitable for determining whether there are leaks in the vacuum bag apparatus 800 can be used without limitation.

After step 124, the method 100 continues with a decision step 126. If there are leaks in the vacuum bag apparatus 800, then step 128 is performed where the method 100 ends. However, if the vacuum bag apparatus 800 is absent of leaks, then step 130 is performed. In step 130, heat is applied to the vacuum bag apparatus 800 for at least partially conforming a circuit board substrate 400 to a three dimensional (3D) contoured surface 206 of a mold structure 204. This step involves equilibrating the circuit board substrate 400 at a temperature which is substantially less than a temperature of a melting point of a circuit board material forming the circuit board substrate 400. In this regard, it should be appreciated that the temperature applied to a circuit board material comprising the single sheet or multilayer laminate is preferably fifty to eighty percent (50-80%), more preferably fifty to seventy percent (50-70%), or most preferably fifty to sixty-five percent (50-65%) of a melting point temperature of the lowest melting component of the circuit board materials. A side view of the vacuum bag apparatus 800 having an increased temperature applied thereto is provided in FIG. 12.

According to an embodiment of the invention, a circuit board substrate 116 is selected as R/flex® 3000 circuit board material available from Rogers Corporation, of Rogers, Conn. A temperature of a melting point for a bondply material (e.g., R/flex® 3908) disposed in the R/flex® 3000 circuit board material system is approximately two hundred ninety degrees Celsius (290° C.). A temperature of a melting point for a core material (R/flex® 3850) disposed in the R/flex® 3000 circuit board material is three-hundred fifteen degrees Celsius (315° C.). As such, a temperature of an environment external to a vacuum bag apparatus 800 is selectively increased from room temperature to two hundred eighteen degrees Celsius (218° C.) at a relatively high ramp rate. Subsequently, the temperature external of an environment external to a vacuum bag apparatus 800 is selectively increased from two hundred eighteen degrees Celsius (218° C.) to two hundred twenty-seven degrees Celsius (227° C.) at a relatively low ramp rate thereby equilibrating the circuit board substrate 400 at a temperature which is substantially less than a temperature of a melting point of a circuit board material, i.e., two hundred ninety degrees Celsius (290° C.) and three-hundred fifteen degrees Celsius (315° C.). With regard to preserving the integrity of optionally included patterned copper cladding, it is preferable to employ a maximum temperature within the enclosure 900 that is the lowest possible temperature consistent with obtaining a desired accuracy between a topology of a molded part and a surface of the tool 206. Thus, a temperature (e.g., 190° C.) near a bottom of a suggested range is preferred when it is necessary to preserve the integrity of a finely patterned cladding. Still, the invention is not limited in this regard.

Referring again to FIG. 1B, the method 100 continues with a step 132 where the pressure differential is increased to fully conform the circuit hoard substrate 400 to the three dimensional (3D) contoured surface 206 of the mold structure 204. This step can involve increasing a pressure in the environment external 1104 to the vacuum bag apparatus 800. According to an embodiment of the invention, a pressure in the environment external 1104 to the vacuum bag apparatus 800 is increased to one hundred pounds per square inch (100 psi). Still, the invention is not limited in this regard.

Figure 13:
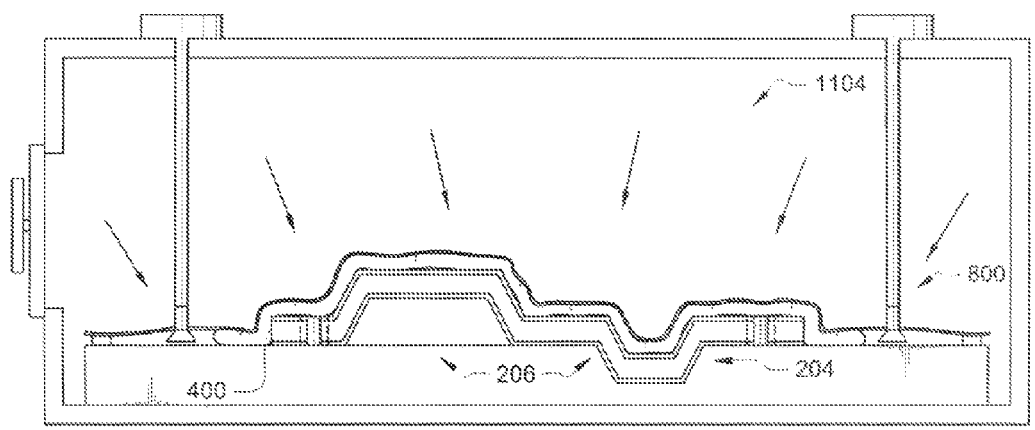
FIG. 13 is a side view of the vacuum bag apparatus having an increased pressure applied thereto that is useful for understanding the invention.
Figure 14:
FIG. 14 is a side view of the vacuum bag apparatus removed from the pressure chamber that is useful for understanding the invention.

A side view of the vacuum bag apparatus 800 having an increased pressure applied thereto is provided in FIG. 13. As shown in FIG. 13, the circuit board substrate 400 is fully conformed to the three dimensional (3D) contoured surface 206 of the mold structure 204.

Referring again to FIG. 1B, the method 100 continues with a decision step 134. If a defined period of time has not expired, then the method 100 continues tracking the amount of time that has passed since the performance of step 132. However, if the defined period of time has lapsed, then the method 100 continues with step 136 of FIG. 1C.

In step 136, the temperature of the environment external 1104 to the vacuum bag apparatus 800 is decreased. For example, the temperature of the environment external 1104 is decreased from two hundred twenty-seven degrees Celsius (227° C.) to twenty-one degrees Celsius (21° C.). In effect, the circuit board substrate 400 is cooled such that it permanently retains it non-planar shape when removed from the bag apparatus 800. In this regard, it should be appreciated that methods for decreasing a temperature of the environment external 1104 to the vacuum bag apparatus 800 are well known to persons skilled in the art. Any such method can be used without limitation.

Referring again to FIG. 1C, the method 100 continues with a step 138. In step 138, the pressure differential is decreased by reducing a pressure external to the vacuum bag apparatus 800. This step can involve decreasing the pressure of the pressure chamber 900. In this regard, it should be appreciated that methods for decreasing the pressure of the pressure chamber 900 are well known to persons skilled in the art. Any such method can be used without limitation.

Figure 15:
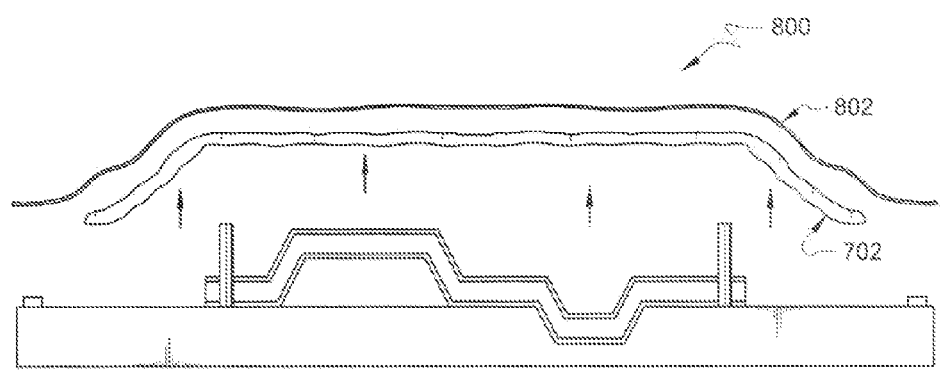
FIG. 15 is a side view of a partially disassembled vacuum bag apparatus that is useful for understanding the present invention.
Figure 16:
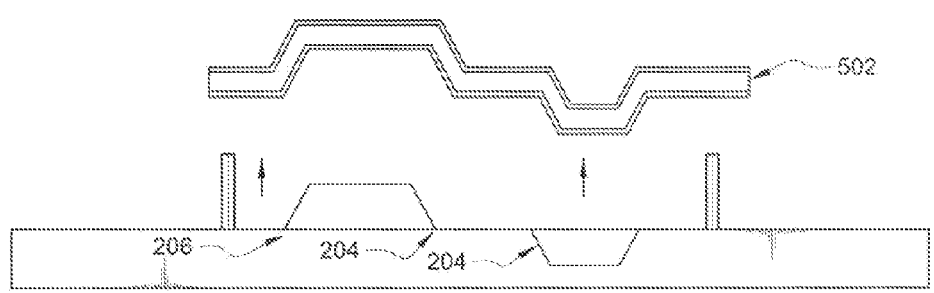
FIG. 16 is a side view of the fabrication materials including a non-planar circuit board substrate removed from the vacuum bag apparatus that is useful for understanding the present invention.

After decreasing the pressure differential, the method continues with step 140 where the vacuum bag apparatus 800 is removed from the pressure chamber 900. A schematic illustration of the vacuum bag apparatus 800 removed from the pressure chamber 900 is provided in FIG. 14. In step 142, the vacuum bag material 802 and the optional breather/absorption material 702 are removed from the vacuum bag apparatus 800 as shown in FIG. 15. Thereafter, the fabrication materials 502 are removed from the three dimensional (3D) contoured surface 208 of the mold structure 204 as shown in FIG. 16. In step 132, a circuit pattern is optionally disposed on the non-planar circuit board substrate 400. After step 132, step 134 is performed where the method 100 ends.

A person skilled in the art will appreciate that the method 100 is one embodiment of a method for forming a non-planar circuit board. However, the invention is not limited in this regard and any other method for forming a non-planar circuit board can be used without limitation. For example, the method 100 can also include disposing a thermocouple monitor in the vacuum bag apparatus 800 or the pressure chamber 900 for reading and logging temperatures in close proximity to the circuit board substrate 400 when heat and pressure are applied thereto. The method 100 can further include securing a part, such as a heat spreader or a heat sink, in a well or cavity formed in the circuit board substrate 400.

Figure 17:
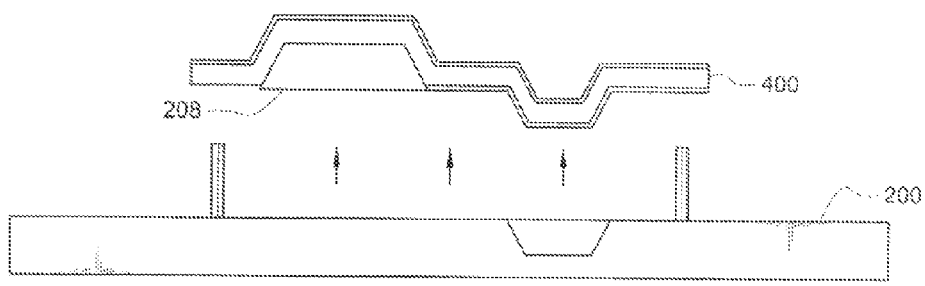
FIG. 17 is a side view of a projecting relief permanently bonded to a circuit board substrate that is useful for understanding the present invention.

According to one alternative embodiment of the invention, a circuit board substrate is permanently adhered to a portion of a three dimensional contoured surface, in this regard, it should be appreciated that this adhesion can be formed by applying heat and pressure to the circuit board substrate disposed on the three dimensional contoured surface. In such a scenario, a circuit board material and/or material forming the three dimensional contoured surface can be selected to produce an adhesive bond between the same when heat and pressure are applied thereto. For example, such circuit board materials include, but are not limited to, a liquid crystal polymer (LCP) or other thermoplastic polymer circuit board material. Such materials forming the three dimensional contoured surface include, but are not limited to, copper, aluminum, and steel. Alternatively, this adhesion can be formed with an adhesive or glue after heat and pressure are applied to the he circuit board substrate and the three dimensional contoured surface. An illustration of the projecting relief 208 permanently coupled to the circuit board substrate 400 is shown in FIG. 17. Still, the invention is not limited in this regard.

According to yet another alternative embodiment of the invention, the method 100 includes selecting the rigid base structure 200 to be a tool. The method 100 also includes selecting the projecting relief 208 to be a part, such as a heat spreader or a heat sink. The method 100 further includes releasably disposing the part on the tool and permanently coupling the part to the circuit board substrate 400 by applying heat and pressure thereto. Subsequently, the circuit board substrate 400 is removed from the tool 200 with the part 208 permanently bonded thereto. An illustration of the circuit board substrate 400 removed from the tool 200 with the part 208 permanently bonded thereto is provided in FIG. 17. Still, the invention is not limited in this regard.

The following Examples are provided in order to further illustrate the present invention. The scope of the invention, however, is not to be considered limited in any way thereby.

EXAMPLE 1

A liquid crystal polymer (LCP) is selected as an R/flex® 3850 LCP core circuit board material available from Rogers Corporation, of Rogers, Conn. The LCP core circuit board material is subjected to an etching process to remove both sides of its two-side electrodeposited copper cladding therefrom. A rigid mold structure (i.e., an embossing tool) having a raised plateau region is machined from aluminum. The raised plateau region is raised above a surrounding region by seventy five hundredths of a millimeter (0.75 mm).

A stack-up is formed by disposing the rigid mold structure on a rigid base structure, the LCP core circuit board material on the rigid mold structure, a release agent on the LCP core circuit board material, and a breather/absorption material on the release agent. Thereafter, the stack-up is placed in a vacuum bag consisting of polyimide film. The vacuum bag is sealed to the rigid base structure with a vacuum sealing tape thereby forming a vacuum bag apparatus. The vacuum sealing tape is selected as AVBS750 available from Airtech International Inc., of Huntington Beach, Calif.

The vacuum bag apparatus is placed within an autoclave and a heat and pressure cycle is initiated. The heat and pressure cycle consists of ramping a temperature of the autoclave to two hundred thirty-two degrees Celsius (232° C.). Once the temperature of the autoclave reaches two hundred thirty-two degrees Celsius (232° C.), a pressure of the autoclave is ramped to seven tenths of a mega Pascal (0.70 MPa). A soak time of one hour (1 hr) at two hundred thirty-two degrees Celsius (232° C.) and seven tenths of a mega Pascal (0.70 MPa) is performed. After one hour (1 hr), the temperature and pressure of the autoclave are reduced. Thereafter, the vacuum bag apparatus is removed from the autoclave. Also, the LCP core circuit board material is removed from the vacuum bag apparatus.

It should be appreciated that the LCP core circuit board material has no deterioration, such as light penetrating through thinned/punctured regions of the LCP core circuit board material. Additionally, the molded LCP core circuit board material is stable in a standard reflow oven environment up to two hundred fen degrees Celsius (210° C.), i.e., an embossed region of the LCP core circuit board does not experience dimensional changes toward an original planar geometry.

EXAMPLE 2

A liquid crystal polymer (LCP) core circuit board material is selected as an R/flex® 3850 LCP core circuit board material available from Rogers Corporation, of Rogers, Conn. The LCP core circuit board material is comprised of an electrodeposited copper cladding having a half an ounce (0.50 oz) weight and a seventeen micrometer (17 µm) thickness. The LCP core circuit hoard material is subjected to an etching process to remove one (1) side of its two-side copper cladding therefrom. The other side of its two-side copper cladding is subjected to an etching process to form a circuit pattern having an array of interconnects suitable for mounting a chip. The array is comprised of bond pads connected by a series of traces. The traces are selected to have widths of fifty micrometers (50 µm), sixty-two and a half micrometers (62.50 µm), and one hundred twenty five micrometers (125 µm).

A rigid mold structure having a raised plateau region is machined from aluminum. The raised plateau region is raised above a surrounding region by approximately sixty three hundredths of a millimeter (0.63 mm). A stack-up is formed by disposing the rigid mold structure on a rigid base structure, the LCP core circuit board material on the rigid mold structure, a release agent on the LCP core circuit board material, and a breather/absorption material on the release agent. Thereafter, the stack-up is placed in a nylon vacuum bag. The nylon vacuum bag is selected as Wrightlon™ Folien WL8400 available from Airtech International Inc., of Huntington Beach, Calif. The vacuum bag is sealed to the rigid base structure with a vacuum sealing tape thereby forming a vacuum bag apparatus. The vacuum sealing tape is selected as GS213-3 available from Airtech International Inc., of Huntington Beach, Calif.

The vacuum bag apparatus is placed within an autoclave and a heat and pressure cycle is initiated. The heat and pressure cycle consists of ramping a temperature of the autoclave to two hundred thirty-two degrees Celsius (232° C.). Once the temperature of the autoclave reaches two hundred thirty-two degrees Celsius (232° C.), a pressure of the autoclave is ramped to seven tenths of a mega Pascal (0.70 MPa). A soak time of one hour (1 hr) at two hundred thirty-two degrees Celsius (232° C.) and seven tenths of a mega Pascal (0.70 MPa) is performed. After one hour (1 hr), the temperature and pressure of the autoclave are reduced. Thereafter, the vacuum bag apparatus is removed from the autoclave. Also, the LCP core circuit board material is removed from the vacuum bag apparatus.

It should be appreciated that the LCP core circuit board material has no evidence of deterioration, such as light penetrating through thinned/punctured regions of the LCP core circuit board material. However, it should also be appreciated that the required elongation to break limit (EL) of the copper traces is near the limit for half an ounce (0.50 oz) electrodeposited copper, i.e., approximately a twenty percent (20%) EL. As a result, a few traces experienced breaks.

EXAMPLE 3

A liquid crystal polymer (LCP) core circuit board material is selected as an R/flex® 3850 LCP core circuit board material available from Rogers Corporation of Rogers, Conn. The LCP core circuit board material is comprised of an electrodeposited copper cladding having a half an ounce (0.50 oz) weight and a seventeen micrometer (17 µm) thickness. The LCP core circuit board material is subjected to an etching process to remove one (1) side of its two-side copper cladding therefrom. The other side of its two-side copper cladding is subjected to an etching process to form a circuit pattern having an array of interconnects suitable for mounting a chip. The array is comprised of bond pads connected by a series of traces. The traces are selected to have widths of fifty micrometers (50 µm), sixty-two and a half micrometers (62.50 µm), and one hundred twenty five micrometers (125 µm).

A rigid mold structure having a raised plateau region is machined from aluminum. The raised plateau region is raised above a surrounding region by approximately sixty three hundredths of a millimeter (0.63 mm). A stack-up is formed by disposing the rigid mold structure on a rigid base structure, the LCP core circuit board material on the rigid mold structure, a release agent on the LCP core circuit board material, and a breather/absorption material on the release agent. Thereafter, the stack-up is placed in a nylon vacuum bag. The nylon vacuum bag is selected as Wrightlon™ Folien WL8400 available from Airtech International Inc., of Huntington Beach, Calif. The vacuum bag is seated to the rigid base structure with a vacuum sealing tape thereby forming a vacuum bag apparatus. The vacuum sealing tape is selected as GS213-3 available from Airtech International Inc., of Huntington Beach, Calif.

The vacuum bag apparatus is placed within an autoclave and a heat and pressure cycle is initiated. The heat and pressure cycle consists of ramping the temperature of the autoclave to one hundred ninety degrees Celsius (190° C.) under a pressure equal to atmospheric pressure that is created by vacuum evacuation of the bag. A soak time of one hour (1 hr) at one hundred ninety degrees Celsius (190° C.) is performed. After one hour (1 hr), the temperature and pressure of the autoclave are reduced. Thereafter, the vacuum bag apparatus is removed from the autoclave. Also, the LCP core circuit board material is removed from the vacuum bag apparatus.

It should be appreciated that the LCP core circuit board material has no evidence of deterioration, such as light penetrating through thinned/punctured regions of the LCP core circuit board material. The temperature and vacuum are sufficient enough to form the LCP material to the shape of the mold without breaking any of the fine circuit line traces, which suggests that the elongation limit of the copper traces has not been exceeded.

EXAMPLE 4

A multi-step approach is implemented to arrive at an embossed multilayer laminate circuit board material. First, two (2) fifty micrometer (50 µm) liquid crystal polymer (LCP) core circuit board materials are selected as R/flex® 3850 available from Rogers Corporation, of Rogers, Conn. Each of the LCP core circuit board materials are subjected to an etching process to remove both sides of a two-side electrodeposited copper cladding therefrom. Subsequently, the LCP core circuit board materials are laminated together by disposing a fifty micrometer (50 µm) bonding film between the LCP core circuit board materials. The bonding film is selected as R/flex® 3908 available from Rogers Corporation, of Rogers, Conn. The laminated LCP core circuit board material is disposed in a vacuum bag apparatus. The vacuum bag apparatus is disposed in an autoclave and a heat and pressure cycle is initiated. The heat and pressure cycle consists of immediately applying a pressure of one and a fourth mega Pascals (1.40 MPa) to the vacuum bag apparatus. The heat and pressure cycle also consists of ramping a temperature of the autoclave to two hundred ninety-six degrees Celsius (296° C.).

Thereafter, a rigid mold structure having a raised plateau region is machined from Teflon®. The raised plateau region is raised above a surrounding region by seventy hundredths of a millimeter (0.75 mm). A stack-up is formed by disposing the rigid mold structure on a rigid base structure, the pre-laminated LCP core circuit board material on the rigid mold structure, a release agent on the pre-laminated LCP core circuit board material, and a breather/absorption material on the release agent. Thereafter, the stack-up is placed in a nylon vacuum bag. The nylon vacuum bag is selected as Wrightlon™ Folien WL8400 available from Airtech International Inc., of Huntington Beach, Calif. The vacuum bag is sealed to the rigid base structure with a vacuum sealing tape thereby forming a vacuum bag apparatus. The vacuum sealing tape is selected as GS213-3 available from Airtech International Inc., of Huntington Beach, Calif.

The vacuum bag apparatus is placed within an autoclave and a heat and pressure cycle is initiated. The heat and pressure cycle consists of ramping a temperature of the autoclave to two hundred thirty-two degrees Celsius (232° C.). Once the temperature of the autoclave reaches too hundred thirty-two degrees Celsius (232° C.), a pressure of the autoclave is ramped to seven tenths of a mega Pascal (0.70 MPa). A soak time of one hour (1 hr) at two hundred thirty-two degrees Celsius (232° C.) and seven tenths of a mega Pascal (0.70 MPa) is performed. After one hour (1 hr), the temperature and pressure of the autoclave are reduced. Thereafter, the vacuum bag apparatus is removed from the autoclave. Also, the pre-laminated LCP core circuit board material is removed from the vacuum bag apparatus.

It should be appreciated that the pre-laminated LCP core circuit board material has no evidence of deterioration, such as light penetrating through thinned regions of the pre-laminated LCP core circuit board material. Additionally, the molded LCP core circuit board material is stable, i.e., an embossed region of the LCP core circuit board does not experience dimensional changes toward an original planer geometry.

EXAMPLE 5

A liquid crystal polymer (LCP) core circuit board material is selected as an R/flex® 3850 LCP core circuit board material available from Rogers Corporation, of Rogers, Conn. The LCP core circuit board material is subjected to an etching process to remove one (1) side of a two-side copper cladding therefrom. The other side of its two-side copper cladding is subjected to an etching process to form a circuit pattern having an array of interconnects suitable for mounting a chip. The array is comprised of bond pads connected by a series of traces. The traces are selected to have widths of fifty micrometers (50 μm), sixty-two and a half micrometers (62.50 μm), and one hundred twenty five micrometers (125 μm).

A rigid mold structure having a raised plateau region is machined from a silicon wafer material. The raised plateau region is raised above a surrounding region by approximately sixty three hundredths of a millimeter (0.63 mm). A stack-up is formed by disposing the rigid mold structure on a rigid base structure, the LCP core circuit board material on the rigid mold structure with its patterned side facing up, a release agent on the LCP core circuit board material, and a breather/absorption material on the release agent. Thereafter, the stack-up is placed in a vacuum bag consisting of a polyimide film. The vacuum bag is sealed to the rigid base structure with a vacuum sealing tape thereby forming a vacuum bag apparatus. The vacuum sealing tape is selected as AVBS750 available from Airtech International Inc., of Huntington Beach, Calif.

The vacuum bag apparatus is placed within an autoclave and a heat and pressure cycle is initiated. The heat and pressure cycle consists of immediately applying a pressure of one and four-tenths of a mega Pascal (1.40 MPa) to the vacuum bag apparatus. The heat and pressure cycle also consists of increasing a temperature of the autoclave to two hundred ninety-six degrees Celsius (296° C.). A soak time of one hour (1.00 hr) at two hundred ninety-six degrees Celsius (296° C.) and one and four-tenths of a mega Pascal (1.40 MPa) is performed. After one hour (1 hr), the temperature and pressure of the autoclave are reduced. Thereafter, the vacuum bag apparatus is removed from the autoclave. Also, the LCP core circuit board material is removed from the vacuum bag apparatus.

The LCP core circuit board material is viewed in reflected light thereby revealing areas of the LCP core circuit board material where the rigid base structure broke through. Also, the LCP core circuit board material shows signs of fibrillation and tearing. Additionally, many of the traces are ruptured.

EXAMPLE 6

A liquid crystal polymer (LCP) is selected as an R/flex™ 3850 LCP core circuit board material available from Rogers Corporation, of Rogers, Conn. The LCP core circuit board material is subjected to an etching process to remove both sides of its two-side electrodeposited copper cladding therefrom. A rigid mold structure having a raised plateau region is machined from aluminum. The raised plateau region is raised above a surrounding region by approximately sixty three hundredths of a millimeter (0.63 mm).

A stack-up is formed by disposing the rigid mold structure on a rigid base structure, the LCP core circuit board material on the rigid mold structure, a release agent on the LCP core circuit board material, and a breather/absorption material on the release agent. Thereafter, the stack-up is placed in a vacuum bag consisting of a polyimide film. The vacuum bag is sealed to the rigid base structure with a vacuum sealing tape thereby forming a vacuum bag apparatus. The vacuum sealing tape is selected as AVBS750 available from Airtech international Inc., of Huntington Beach, Calif.

The vacuum bag apparatus is placed within an autoclave and a heat and pressure cycle is initiated. The heat and pressure cycle consists of ramping a temperature of the autoclave to two hundred ninety-six degrees Celsius (296° C.). Once the temperature of the autoclave reaches two hundred ninety-six degrees Celsius (296° C.), a pressure having a value of seven tenths of a mega Pascal (0.70 MPa) is applied to the vacuum hag apparatus. A soak time of one hour (1 hr) at two hundred ninety-six degrees Celsius (296° C.) and seven tenths of a mega Pascal (0.70 MPa) is performed. After one hour (1 hr), the temperature and pressure of the autoclave are reduced. Thereafter, the vacuum bag apparatus is removed from the autoclave. Also, the LCP core circuit board material is removed from the vacuum bag apparatus.

In this case, no tearing or fibrillation of the LCP core circuit board material is observed. However, there is excessive thinning of the LCP core circuit board material in the regions corresponding to a top edge of the rigid mold structure. Also, there are apertures in the LCP core circuit board material from edges of the rigid mold structure, All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

We claim:

1. A method for forming a circuit board, comprising:
   forming a circuit board substrate from a circuit board material;
   disposing a circuit pattern on said circuit board substrate;
   positioning said circuit board substrate on a rigid structure having a three dimensional contoured surface; and
   applying heat and applying pressure to said circuit board substrate using a vacuum-bag autoclave process to at least partially conform said circuit board substrate to said three dimensional contoured surface;
   wherein said vacuum-bag autoclave process comprises increasing a temperature of an environment surrounding said circuit board substrate from a first temperature to a second temperature, and maintaining said second temperature for a period of time that is sufficient for thermally equilibrating said circuit board substrate at said second temperature which is 50-80% of a melting point temperature of the circuit board material;
   wherein said second temperature is selected to preserve an integrity of said circuit pattern and to obtain a desired accuracy between a topology of said circuit board substrate and said three dimensional contoured surface of a rigid structure.

2. The method according to claim 1, further comprising disposing a circuit pattern on said circuit board substrate after said step of performing said vacuum-bag autoclave process.

3. The method according to claim 1, further comprising selecting said circuit board substrate to have a planar configuration.

4. The method according to claim 1, further comprising selecting said circuit board material to be a thermoplastic polymer material.

5. The method according to claim 4, further comprising selecting said circuit board material to be a liquid crystal polymer material.

6. The method according to claim 5, further comprising selecting said thermoplastic polymer material to include a plurality of material layers.

7. The method according to claim 1, further comprising disposing a release agent between said circuit board substrate and said three dimensional contoured surface prior to said positioning step.

8. The method according to claim 7, further comprising selecting said release agent from the group consisting of one or more of a lubricant, a wax, a film, and a release liner.

9. The method according to claim 7, further comprising removing said circuit board substrate from said three dimensional contoured surface after said steps of applying heat and applying pressure.

10. The method according to claim 1, further comprising permanently adhering said substrate to said three dimensional contoured surface in said steps of applying heat and applying pressure.

11. The method according to claim 10, further comprising disposing an adhesive agent between said substrate and said three dimensional contoured surface prior to said positioning step.

12. The method according to claim 10, further comprising selecting at least one of said circuit board material and a material forming said three dimensional contoured surface to produce an adhesive bond between said circuit board material and said three dimensional contoured surface in said steps of applying heat and applying pressure.

13. The method according to claim 1, further comprising positioning said circuit board substrate and said rigid structure in an interior of a vacuum bag, and creating a pressure differential comprising a reduced pressure within said interior of said vacuum bag relative to an environment external to said vacuum bag.

14. The method according to claim 13, wherein said step of creating said pressure differential includes evacuating at least a portion of a gas contained in an interior of said vacuum bag.

15. The method according to claim 13, wherein said step of creating said pressure differential includes positioning said circuit board substrate and said rigid structure in a pressure chamber, and increasing a pressure in said pressure chamber.

16. The method according to claim 13, further comprising increasing said pressure differential after said step of applying heat.

17. The method according to claim 1, further comprising selecting said rigid structure to include a tool and a part releasably disposed on said tool.

18. The method according to claim 17, further comprising permanently bonding said part to said circuit board substrate.

19. The method according to claim 18, further comprising removing from said tool said circuit board substrate with said part permanently bonded thereto after said steps of applying heat and applying pressure.

20. A method for forming a circuit board, comprising:
   forming a circuit board substrate from a circuit board material;
   disposing a circuit pattern on said circuit board substrate;
   positioning said circuit board substrate on a rigid structure having a three dimensional contoured surface; and
   applying heat and applying pressure to said circuit board substrate using a vacuum-bag autoclave process to at least partially conform said circuit board substrate to said three dimensional contoured surface;
   wherein said vacuum-bag autoclave process comprises:
      increasing a temperature of an environment surrounding said circuit board substrate from a first temperature to a second temperature;
      maintaining said second temperature for a period of time that is sufficient for thermally equilibrating said circuit board substrate at said second temperature which is 50-80% of a melting point temperature of the circuit board material; and
      subsequent to said equilibration of said circuit board substrate, applying pressure to said circuit board substrate;
   wherein said second temperature is selected to preserve an integrity of said circuit pattern and to obtain a desired accuracy between a topology of said circuit board substrate and said three dimensional contoured surface of a rigid structure.

21. A method for forming a circuit board, comprising:
   forming a circuit board substrate from a liquid crystal polymer material;
   disposing a circuit pattern on said circuit board substrate;

positioning said circuit board substrate on a rigid structure having a three dimensional contoured surface; and applying heat and applying pressure to said circuit board substrate using a vacuum-bag autoclave process to at least partially conform said circuit board substrate to said three dimensional contoured surface;

wherein said vacuum-bag autoclave process comprises increasing a temperature of an environment surrounding said circuit board substrate from a first temperature to a second temperature, and maintaining said second temperature for a period of time that is sufficient for thermally equilibrating said circuit board substrate at said second temperature which is 50-80% of a melting point temperature of the liquid crystal polymer material;

wherein said second temperature is selected to preserve an integrity of said circuit pattern and to obtain a desired accuracy between a topology of said circuit board substrate and said three dimensional contoured surface of a rigid structure.

* * * * *